(12) United States Patent
Weis

(10) Patent No.: US 9,496,859 B2
(45) Date of Patent: Nov. 15, 2016

(54) CIRCUIT ARRANGEMENT WITH A FIRST SEMICONDUCTOR DEVICE AND WITH A PLURALITY OF SECOND SEMICONDUCTOR DEVICES

(71) Applicant: Infineon Technologies Dresden GmbH, Dresden (DE)

(72) Inventor: Rolf Weis, Dresden (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 14/714,957

(22) Filed: May 18, 2015

(65) Prior Publication Data

US 2015/0256163 A1    Sep. 10, 2015

Related U.S. Application Data

(62) Division of application No. 13/599,946, filed on Aug. 30, 2012, now Pat. No. 9,035,690.

(51) Int. Cl.
*H03K 5/08* (2006.01)
*H03K 17/567* (2006.01)
*H03K 17/10* (2006.01)
*H03K 17/687* (2006.01)

(52) U.S. Cl.
CPC .............. *H03K 5/08* (2013.01); *H03K 17/102* (2013.01); *H03K 17/567* (2013.01); *H03K 17/687* (2013.01); *H03K 2017/6875* (2013.01)

(58) Field of Classification Search
CPC ................... H03K 17/567; H03K 2017/6875; H03K 5/08; H03K 17/687; H03K 17/102
See application file for complete search history.

(56) References Cited

U.S. PATENT DOCUMENTS

| | | | |
|---|---|---|---|
| 4,692,643 A | 9/1987 | Tokunaga et al. | |
| 7,148,736 B1 | 12/2006 | Tihanyi et al. | |
| 8,760,214 B2 | 6/2014 | Biela et al. | |
| 2007/0273428 A1* | 11/2007 | Theiler | H03K 17/102 327/436 |
| 2010/0253319 A1 | 10/2010 | Cehelnik | |
| 2011/0291738 A1 | 12/2011 | Biela et al. | |
| 2012/0175634 A1 | 7/2012 | Weis | |
| 2013/0193525 A1 | 8/2013 | Weis et al. | |

FOREIGN PATENT DOCUMENTS

| | | |
|---|---|---|
| CN | 102308477 | 1/2012 |
| DE | 19926109 | 12/2000 |

* cited by examiner

*Primary Examiner* — Jung Kim
(74) *Attorney, Agent, or Firm* — Slater Matsil, LLP

(57) ABSTRACT

A circuit arrangement includes a first semiconductor device having a load path and a number of second semiconductor devices. Each second semiconductor device has a control terminal and a load path between a first load terminal and a second load terminal. The second semiconductor devices have their load paths connected in series and connected in series with the load path of the first semiconductor device. Each of the second semiconductor devices has a load terminal of one of the first semiconductor device and of one of the second semiconductor devices associated thereto and a voltage limiting element coupled between the control terminal of one of the second semiconductor devices and the load terminal associated with that one of the second semiconductor devices.

13 Claims, 4 Drawing Sheets

CIRCUIT ARRANGEMENT WITH A FIRST SEMICONDUCTOR DEVICE AND WITH A PLURALITY OF SECOND SEMICONDUCTOR DEVICES

This is a divisional application of U.S. application Ser. No. 13/599,946, entitled "Circuit Arrangement with a First Semiconductor Device and with a Plurality of Second Semiconductor Devices" which was filed on Aug. 30, 2012 (now U.S. Pat. No. 9,035,690) and is incorporated herein by reference.

TECHNICAL FIELD

Embodiments of the present invention relate to a circuit arrangement with a first semiconductor device such as a transistor or a diode, and with a plurality of second semiconductor devices, such transistors, in particular low-voltage transistors, that may be used as a power semiconductor device.

BACKGROUND

One important aim in the development of power semiconductor devices, such as power transistors or power diodes, is to produce devices with a high voltage blocking capability but, nevertheless, a low on-resistance ($R_{ON}$) in case of a transistor and a low forward voltage drop in case of a diode. Further, it is desired to have low losses when the power semiconductor device changes between an on-state (blocking state) and an off-state (conducting state).

Power transistors usually include a drift region arranged between a body region and a drain region and doped lower than the drain region. The on-resistance of a conventional power transistor is dependent on the length of the drift region in a current flow direction and on the doping concentration of the drift region, wherein the on-resistance decreases when the length of the drift region is reduced or when the doping concentration in the drift region is increased. However, reducing the length of the region or increasing the doping concentration reduces the voltage blocking capability.

One possible way to reduce the on-resistance of a power transistor having a given voltage blocking capability is to provide compensation regions in the drift region, wherein the compensation regions are doped complementary to the drift region. Another possible way is to provide field plates in the drift region which are dielectrically insulated from the drift region and which are, for example, connected to a gate or source terminal of the transistor. In these types of power transistors, the compensation zones or the field plates partly "compensate" doping charges in the drift region when the component is in its off-state. This allows to provide a higher doping of the drift region—which reduces the on-resistance—without reducing the voltage blocking capability.

A power diode (pin diode) usually includes a low doped drift or base region between a first emitter region of a first doping type and a second emitter region of a second doping type. A power diode blocks when a voltage with a first polarity (blocking voltage) is applied between the first and second emitter regions, and conducts when a voltage with a second polarity is applied between the first and second emitter regions. In the conducting state, however, a charge carrier plasma with charge carriers of the first and second type (p-type and n-type charge carriers) is generated in the base region. The amount of charge carrier plasma stored in the base region is dependent on a length of the base region and is, therefore, dependent on the voltage blocking capability, where the amount of charge carrier plasma increases when the voltage blocking capability increases. This charge carrier plasma has to be removed before the diode may block upon applying a blocking voltage.

Recently a new type of power semiconductor device referred to as ADR (Active Drift Region) device or ADZ (Active Drift Zone) device has been proposed. An ADR device such as an ADRFET (Active Drift Region Field-Effect Transistor) or an ADR diode includes a first semiconductor device such as a transistor or a diode, and a plurality of second semiconductor device such as transistors connected in series with the first semiconductor device. The second semiconductor devices form the Active Drift Region of the device and are interconnected such that the operation states of the second semiconductor devices follow the operation state of the first semiconductor device. That is, the second semiconductor devices are conducting when the first semiconductor device is conducting, and the second semiconductor devices are blocking when the first semiconductor device is blocking. The overall voltage blocking capability of the power semiconductor device corresponds to the sum of the voltage blocking capabilities of the individual second semiconductor devices. That is, the individual second transistors share the overall blocking voltage applied to the power semiconductor device.

According to one approach, the second semiconductor devices in an ADR device are implemented as normally-on transistors such as depletion MOSFETs (Metal Oxide Field-Effect Transistors) or JFETs (Junction Field Effect Transistors). Each of these normally on-transistors has a control terminal (gate terminal) connected to the load terminal (drain or source terminal) of one of the other second transistors. Depletion MOSFETs or JFETs are voltage controlled devices that can be switched on and off through a control voltage applied between the control terminal and one of the load terminals. When the second transistors are interconnected as explained above, the control voltage of one second semiconductor device corresponds to the load path voltage of at least one other second semiconductor device. This is usually noncritical when the second semiconductor devices are implemented with a low voltage blocking capability such as a voltage blocking capability of between 5V and 20V. In these devices, the maximum voltage that can be applied as a control voltage is in the same voltage range.

However, it may desirable to use second semiconductor devices with higher blocking voltages such as blocking voltages of up to several 10V or even up to several 100V in order to provide a power semiconductor device with a voltage blocking capability of several kilovolts (kV). Usually, these semiconductor devices are not capable of withstanding control voltages that are as high as several 10V or even several 100V.

There is therefore a need to provide a semiconductor device arrangement with a first semiconductor device and with a plurality of second semiconductor devices that is implemented with second semiconductor devices having high blocking voltages.

SUMMARY OF THE INVENTION

One embodiment relates a circuit arrangement. The circuit arrangement includes a first semiconductor device having a load path, and a plurality of second semiconductor devices. Each second semiconductor device has a load path between a first load terminal and a second load terminal and a control terminal. The second semiconductor devices have their load paths connected in series and connected in series to the load path of the first semiconductor device, and each of the second semiconductor devices has a load terminal of one of the first semiconductor device and one of the second semiconductor devices associated thereto. Further, a voltage limiting element is coupled between the control terminal of at least one of the second semiconductor devices and the load terminal associated with the at least one second semiconductor device.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced.

Embodiments of the present invention relate to a circuit arrangement (a semiconductor device arrangement), in particular a circuit arrangement that has the functionality of a power semiconductor device such as a power transistor or a power diode. The circuit arrangement includes a first semiconductor device and a plurality of second semiconductor devices. The first semiconductor device is, e.g., implemented as one of a transistor and a diode and defines the functionality of the circuit arrangement, while the second semiconductor devices mainly define the voltage blocking capability of the circuit arrangement.

Figure 1:
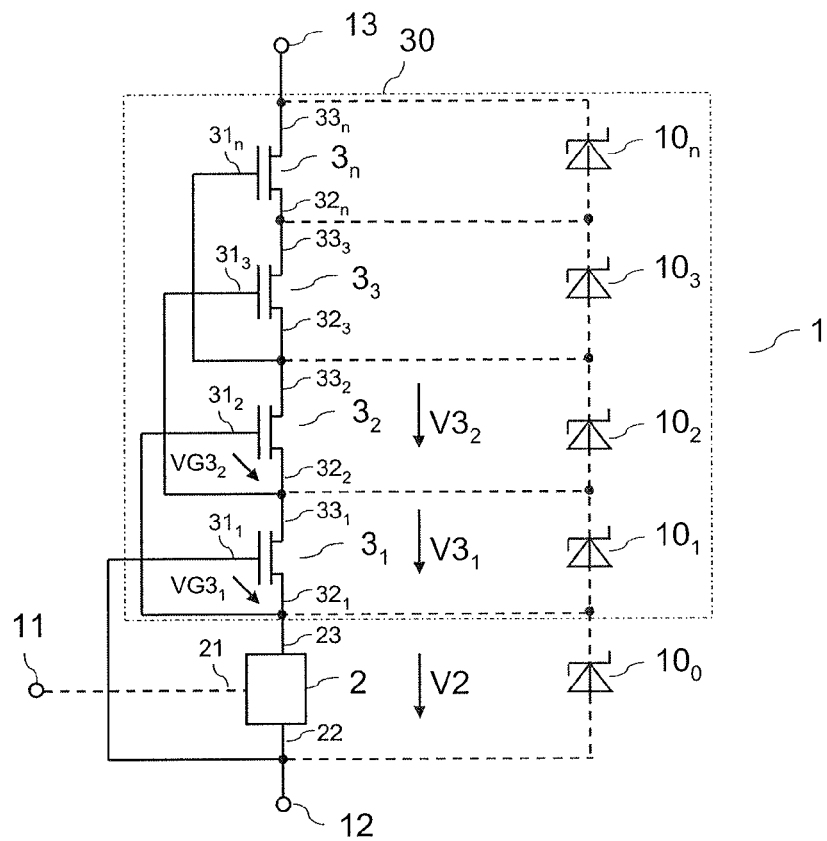
FIG. 1 illustrates a circuit arrangement with a first semiconductor device and with a plurality of second semiconductor devices.

Before explaining embodiments of the invention in detail, the basic principle of a circuit arrangement with a first semiconductor device and with a plurality of second semiconductor devices is explained with reference to FIG. 1. In FIG. 1, reference character 1 denotes the circuit arrangement. The circuit arrangement 1 includes a first load terminal 12, a second load terminal 13, an optional control terminal 11, a first semiconductor device 2 and a plurality of second semiconductor devices $3_1$-$3_n$. The first semiconductor device 2 has an optional control terminal 21 coupled to the control terminal 11 of the circuit arrangement, and a load path between a first load terminal 22 and a second load terminal 23. The first load terminal 22 of the first semiconductor device 2 is coupled to the first load terminal 12 of the circuit arrangement. The first semiconductor device 2 is operable to assume one of two different operation states, namely an on-state (conducting state), in which the load path 22-23 conducts a current, and an off-state (blocking state), in which the load paths 22-23 blocks.

Figure 3:
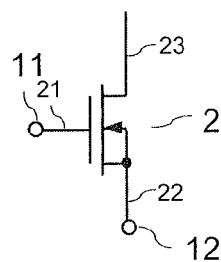
FIG. 3 illustrates a first semiconductor device implemented as an n-type depletion MOSFET.
Figure 4:
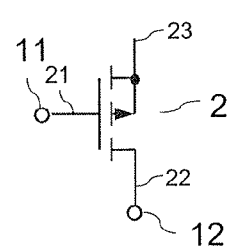
FIG. 4 illustrates a first semiconductor device implemented as a p-type enhancement MOSFET.

The first semiconductor device 2 is only schematically illustrated in FIG. 1. The first semiconductor device 2, that defines the electrical behavior of the circuit arrangement 1, can be implemented in one of many different ways. According to one embodiment, the first semiconductor device 2 can be implemented as a transistor device such as a MOSFET (Metal Oxide Semiconductor Field-Effect Transistor), a FINFET or a nanotube, an IGBT (Insulated Gate Bipolar Transistor), a BJT (Bipolar Junction Transistor), or a JFET (Junction Field-Effect Transistor). Each of these different types of transistors has a drain-source path or a collector-emitter path forming the load path 22-23, and has a gate terminal or a base terminal forming the control terminal 21. Just for illustration purposes, three different types of transistors that may be used to implement the first semiconductor device 2 are illustrated in FIGS. 2 to 4.

Figure 2:
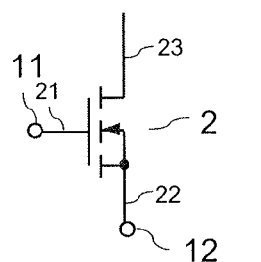
FIG. 2 illustrates a first semiconductor device implemented as an n-type enhancement MOSFET.
Figure 5:
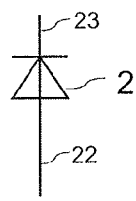
FIG. 5 illustrates a first semiconductor device implemented as a diode.

Referring to FIG. 2, the first semiconductor device 2 may be implemented as an n-type enhancement MOSFET with a source terminal forming the first load terminal 22, a drain terminal forming the second load terminal 23, and a gate terminal forming the control terminal 21. Referring to FIG. 3, the first semiconductor device 2 may be implemented as an n-type depletion MOSFET with a source terminal forming the first load terminal 22, a drain terminal forming the second load terminal 23, and a gate terminal forming the control terminal 21. Referring to FIG. 4, the first semiconductor device 2 may be implemented as a p-type enhancement MOSFET with a drain terminal forming the first load terminal 22, a source terminal forming the second load terminal 23, and a gate terminal forming the control terminal 21. According to a further embodiment, that is illustrated in FIG. 5, the first semiconductor device is implemented as a diode with an anode terminal forming the first load terminal 22, and a cathode terminal forming the second load terminal 23, but without a control terminal.

In FIG. 1 as well as in the following figures reference number "3" followed by a subscript index denotes the individual second semiconductor devices. Same parts of the individual second semiconductor devices, such as control terminals and load terminals, have the same reference character followed by an subscript index. For example, $3_1$ denotes a first one of the second semiconductor devices that has a control terminal $31_1$ and first and second load terminals $32_1$, $33_1$. In the following, when reference is made to an arbitrary one of the second semiconductor devices or to the plurality of the second semiconductor devices, and when no differentiation between individual second semiconductor devices is required, reference numbers 3, 31, 32, 33 without indices will be used to denote the second semiconductor devices and their individual parts.

The second semiconductor devices 3 are implemented as transistor devices (transistors) in the embodiment illustrated in FIG. 1 and will be referred to as second transistors in the following. Each of the second transistors 3 has a control terminal 31 and a load path between a first load terminal 32 and a second load terminal 33. The load paths 32-33 of the second semiconductor devices are connected in series with each other so that the first load terminal of one second transistor is connected to the second load terminal of a second transistor adjacent in the series circuit. Further, the load paths of the second transistors 3 are connected in series with the load path 22-23 of the first semiconductor device 2, so that the first semiconductor device 1 and the plurality of second transistors 3 form a cascode-like circuit.

Referring to FIG. 1, there are n second transistors 3, with n≥2. From these n second transistors 3, a 1st second transistor $3_1$ is arranged closest to first semiconductor device 2 in the series circuit with the n second transistors 3 and has its load path $32_1$-$33_1$ directly connected to the load path 22-23 of the first semiconductor device 2. An n-th second transistors $3_n$ is arranged most distant to first semiconductor device 2 in the series circuit with the n second transistors 3. In the embodiment illustrated in FIG. 1, there are n=4 second transistors 3. However, this is only an example, the number n of second transistors 3 can be selected arbitrarily, namely dependent on a desired voltage blocking capability of the circuit arrangement 1 between the first and second load terminals. This is explained in greater detail herein below.

Each of the second transistors 3 has its control terminal 31 connected to one of the load terminals of another one of the second transistors 3 or to one of the load terminals of the first transistor 2. In the embodiment illustrated in FIG. 1, the 1st second transistor $3_1$ has its control terminal $31_1$ connected to the first load terminal 22 of the first transistor 2. Each of the other second transistors $3_2$-$3_n$ have their control terminal $31_2$-$31_n$ connected to the first load terminal $32_1$-$32_{n-1}$ of the second transistor that is adjacent in the series circuit in the direction of the first semiconductor device 2. Assume, for explanation purposes, that $3_i$ is one of the second transistors $3_2$-$3_n$ other than the 1st second transistor $3_1$. In this case, the control terminal $31_i$ of this second transistor (upper second transistor) $3_i$ is connected to the first load terminal $32_{i-1}$ of an adjacent second transistor (lower second transistor) $3_{i-1}$. The first load terminal $32_{i-1}$ of the lower second transistor $3_{i-1}$ to which the control terminal of the upper second transistor $3_i$ is connected to is not directly connected to one of the load terminals $32_i$, $33_i$ of this upper second transistor $3_i$. According to a further embodiment (not illustrated), a control terminal $31_i$ of one second transistor $3_i$ is not connected to the first load terminal $31_{i-1}$ of that second transistor $3_{i-1}$ that is directly connected to the second transistor $3_i$, but is connected to the load terminal $32_{i-k}$ of a second transistor $3_{i-k}$, with k>1, farther away from the transistor. If, for example, k=2, then the control terminal $31_i$ of the second transistor $3_i$ is connected to the first load terminal $32_{i-2}$ of the second transistor $3_{i-2}$ that is two second transistors away from the second transistor $3_i$ in the direction of the first transistor 2 in the series circuit.

In the embodiment illustrated in FIG. 1, the second transistors 3 are normally-on (depletion) transistors. However, this is only an example. Each of the first semiconductor device 2 and the second transistors 3 can be implemented as a normally-on transistor or as a normally-off transistor. The individual transistors can be implemented as n-type transistors or as p-type transistors. Implementing the second transistors 3 as MOSFETs is only an example. Any type of transistor can be used to implement the first semiconductor device 2 and the second transistors 3, such as a MOSFET, a MISFET, a MESFET, an IGBT, a JFET, a FINFET, a nanotube device, an HEMT, etc. Independent of the type of device used to implement the first semiconductor device 2 and the second semiconductor devices 3, these devices are connected such that each of the second semiconductor devices 3 is controlled by the load path voltage of at least one other second semiconductor devices 3 or by the load path voltage of the first semiconductor device 2.

Just for illustration purposes, the individual second transistors 3 are implemented as depletion MOSFETs in the embodiment of FIG. 1. Each of the MOSFETs 3 has a gate terminal as a control terminal 21, 31, a source terminal as a first load terminal 22,32, and a drain terminal as a second load terminal 23, 33. MOSFETs are voltage controlled devices that can be controlled by the voltage applied between the gate and source terminals (the control terminal and the first load terminal). Thus, in the arrangement illustrated in FIG. 1, the 1st second transistors $3_1$ is controlled through a voltage that corresponds to the load path voltage V2 of the first semiconductor device 2, and the other second transistors $3_i$ are controlled through the load path voltage of at least one second transistor $3_{i-1}$ or $3_{i-2}$. The "load path" voltage of one MOSFET is the voltage between the first and second load terminals (drain and source terminal) of this MOSFET.

The operating principle of the circuit arrangement 1 of FIG. 1 is explained in the following. Just for explanation purposes it is assumed that the first semiconductor device 2 is implemented as a transistor, that the second transistors 3 are implemented as n-type depletion MOSFETs or n-type JFETs, and that the individual devices 2, 3 are interconnected as illustrated in FIG. 1. The basic operating principle, however, also applies to semiconductor device arrangements implemented with other types of first and second semiconductor devices. Further, it is assumed that the circuit arrangement 1 is connected in series with a load Z and that the series circuit with the load Z and the circuit arrangement is connected between supply terminals where a supply voltage V1 is available.

A depletion MOSFET and a JFET are similar in terms of their electrical behavior. A depletion MOSFET conducts when a drive voltage (gate-source voltage) is applied that is above a predefined threshold voltage. In an n-type depletion MOSFET, the threshold voltage is negative so that the MOSFET conducts when a drive voltage of about zero is applied. The MOSFET blocks when the drive voltage decreases to below the negative threshold voltage, that is when the drive voltage is more negative than the threshold voltage. The "drive voltage" is the voltage between the gate terminal and the source terminal of the device.

An n-type JFET conducts when a drive voltage is applied that is more positive than a negative pinch-off voltage. Thus, the n-type JFET conducts when a drive voltage of about zero is applied. The JFET blocks when the drive voltage decreases to below the pinch-off voltage, that is when the drive voltage is more negative than the pinch-off voltage. While in an n-type depletion MOSFET or n-type JFET the threshold voltage and the pinch-off voltage, respectively, is a negative voltage, the threshold voltage (pinch-off voltage) is a positive voltage in a p-type depletion MOSFET or JFET.

In the circuit arrangement of FIG. 1, the 1st second transistor $3_1$ is controlled by the negative load path voltage V2 of the first semiconductor device 2, the 2nd second transistor is controlled by the negative load path voltage $V3_1$ of the 1st second transistor device $3_1$, etc. That is: $VG3_1=-V2$, $VG3_2=-V3_1$, etc., where $VG3_1$, $VG3_2$ are the gate-source voltages of the second transistors $3_1$, $3_2$. For explanation purposes it is assumed that the first semiconductor device 2 is in an off-state and that the magnitude of the load path voltage V2 of the first semiconductor device 2 is high enough to switch off (keep in an off-state) the 1st semiconductor device $3_1$. The 1st second transistor device $3_1$ then switches off (keeps in an off-state) the 2nd second transistor device $3_2$, and so on. The number of second transistors that switch off is dependent on the supply voltage V1 applied to the series circuit. As the voltage across the circuit arrangement reaches the supply voltage, a voltage across the load Z becomes zero.

When the first semiconductor device 2 is switched on by applying a suitable drive potential to the control terminal 11, the load path voltage V2 of the first semiconductor device V2 decreases. As this load path voltage V2 (more precisely: as the negative load path voltage—V2) reaches the threshold voltage of the 1st second transistor $3_1$ the 1st second transistor $3_1$ starts to conduct so that the load path voltage V$3_1$ of the 1st second transistor $3_1$ decreases. Consequently, the second transistor $3_2$ controlled by the load path voltage V$3_1$ of the 1st second transistor $3_1$ also starts to conduct, etc. In other words, the first semiconductor device 2 and each of the second transistors 3 are finally conducting so that the circuit arrangement 1 is in an on-state.

When the circuit arrangement 1 is in an on-state and when the first semiconductor device 2 is switched off, the voltage drop across the load path of the first semiconductor device 2 increases, so that the 1st second transistor $3_1$ starts to switch off when the negative load-path voltage—V2 becomes more negative than the threshold voltage of the 1st second transistor $3_1$. When the 1st second transistor $3_1$ is switched off, the voltage drop across its load path increases so that the 2nd second transistor $3_2$ is switched off, which in turn switches off the 3rd second transistor, and so on, until each of the second transistors 3 is switched off and the semiconductor device arrangement 1 is finally in a stable off-state. The external voltage applied between the second and first terminals 13 and 12 switches as many 2nd transistors from the on-state to the off-state as required to distribute the external voltage over the first semiconductor device 2 and the second transistors 3. When applying a low external voltage, some second transistor are still in the on-state, while others are in the off-state. The number of second transistors that are in the off-state increases as the external voltage increases. Thus, when a high external voltage is applied, that is in the range of the voltage blocking capability of the overall semiconductor device arrangement, the first semiconductor device and each of the second transistors are in the off-state.

When the circuit arrangement 1 is in an off-state and when the first semiconductor device 2 is switched on, the voltage drop across the load path of the first transistor 2 decreases so that it switches on the 1st second transistor $3_1$, which in turn switches on the 2nd second transistor $3_2$, and so on. This continues until each of the second transistors 3 is again switched on.

The switching states of the second transistors 3 connected in series with the first semiconductor device 2 are dependent on the switching state of the first semiconductor device 2 and follow the switching state of the first semiconductor device 2. Thus, the switching state of the semiconductor arrangement 1 is defined by the switching state of the first semiconductor device 2. The circuit arrangement 1 is in an on-state (conducting state) when the first semiconductor device 2 is in an on-state, and the circuit arrangement 1 is in an off-state (blocking state) when the first semiconductor device 2 is in an off-state.

The semiconductor arrangement 1 has a low resistance between the first and second load terminals 12, 13 when it is in an on-state, and has a high resistance between the first and second load terminals 12, 13 when it is in an off-state.

In the on-state, an ohmic resistance between the first and second load terminals 12, 13 corresponds to the sum of the on-resistances $R_{ON}$ of the first semiconductor device 2 and the second transistors 3. A voltage blocking capability, which is the maximum voltage that can be applied between the first and second load terminals 12, 13 when the circuit arrangement is in an off-state before an Avalanche breakthrough sets in, corresponds to the sum of the voltage blocking capabilities of the first semiconductor device 2 and the second transistors 3.

The voltage blocking capability and the on-resistance of the circuit arrangement 1 are defined by the voltage blocking capabilities of the first transistor 2 and the second transistors 3 and by the on-resistances of the first transistor 2 and the second transistors 3, respectively. When the arrangement 30 with the second transistors 3 is implemented with significantly more than two second transistors 3 (n>>2), such as more than 5, more than 10, or even more than 20 second transistors 3, the voltage blocking capability and the on-resistance of the circuit arrangement 1 are mainly defined by the arrangement 30 with the second transistors 3. The overall circuit arrangement 1 can be operated like a conventional power transistor when the first semiconductor device 2 is implemented as a transistor. In a conventional power transistor, an integrated drift region mainly defines the on-resistance and the voltage blocking capability. Thus, the arrangement 30 with the second transistors 3 has a function that is equivalent to the drift region in a conventional power transistor. The arrangement 30 with the second transistors 30 can, therefore, be referred to as active drift region (ADR) or active drift zone (ADZ). The overall semiconductor device arrangement 1 of FIG. 1 can be referred to as ADZ transistor or ADR transistor (ADZ transistor) or as ADRFET (ADZFET), when the first semiconductor device is implemented as a MOSFET.

When the first semiconductor device 2 is implemented as a diode, the operating principle of the circuit arrangement 1 corresponds to the operating principle of a power diode. In this case, the circuit arrangement 1 conducts when a voltage is applied between the first and second load terminals 11, 12 that forward biases the diode 2. The forward biased diode 2 switches on the 1st second transistors $3_1$ which switches on the 2nd second transistor $3_2$, and so on. The circuit arrangement blocks when a voltage is applied between the first and second load terminals 11, 12 that reverse biases the diode 2. The reverse biased diode switches off the $1^{st}$ second transistors $3_1$ which switches off the 2nd second transistor $3_2$, and so on. When implementing the second transistor arrangement 30 with n-type depletion MOSFETs or n-type JFETs the cathode terminal 23 of the diode 2 (see FIG. 5) is connected to the source terminal of the 1st second transistor $3_1$. In a circuit arrangement 1 with a diode as the first semiconductor device 2 and with a plurality of MOSFETs or JFETs as second transistors a lower amount of charge carrier plasma is stored than in a conventional power diode. Thus, the reverse recovery behavior of a circuit arrangement 1 with a diode as the first semiconductor device 2 and with a plurality of MOSFETs or JFETs as second transistors 3 is improved relative to the reverse recovery behavior of a conventional power diode.

When the semiconductor device arrangement 1 is in an off-state (blocking), the voltage applied between the first and second load terminals 12, 13 is distributed such that a part of this voltage drops across the load path 22-23 of the first transistor 2, while other parts of this voltage drop across the load paths of the second transistors 3. However, there may be cases in which there is no equal distribution of this voltage to the second transistors 3. Instead, those second transistors 3 that are closer to the first semiconductor device 2 may have a higher voltage load than those second transistors 3 that are more distant to the first semiconductor device 2.

In order to more equally distribute the voltage to the second transistors 3, the circuit arrangement optionally includes voltage limiting means $10_1$-$10_n$ that are configured to limit or clamp the voltages across the load paths of the second transistors 3. Optionally, a clamping element $10_0$ is also connected in parallel to the load path (between the source and drain terminals) of the first semiconductor device 2. These voltage clamping means $10_0$-$10_n$ can be implemented in many different ways. Just for illustration purposes the clamping means $10_0$-$10_n$ illustrated in FIG. 1 includes Zener diodes $10_0$-$10_n$, with each Zener diode $10_0$-$10_n$ being connected in parallel with the load path of one of the second transistors 3 and, optionally, the first transistor 2.

Instead of the Zener diodes $10_0$-$10_n$, tunnel diodes, PIN diodes, avalanche diodes, or the like, may be used as well. According to a further embodiment (not illustrated), the individual clamping elements $10_0$-$10_n$ are implemented as transistors, such as, for example, p-type MOSFETs when the second transistors 3 are n-type MOSFETs. Each of these clamping MOSFETs has its gate terminal connected to its drain terminal, and the load path (the drain-source path) of each MOSFET is connected in parallel with the load path of one second transistor 3. Each of the individual clamping elements, such as the Zener diodes $10_0$-$10_n$ illustrated in FIG. 1, can be integrated in the same semiconductor body as the semiconductor device (the first semiconductor device 2 or the second transistors 3) it is coupled thereto.

In the circuit arrangement of FIG. 1, the first semiconductor device 1 and the individual second transistors may have relatively low voltage blocking capabilities compared such as voltage blocking capabilities of between 3V and 50V. However, dependent on the number n of second transistors 3 a high overall voltage blocking capability of up to several 100V, such as 600V or more, can be obtained. In some fields of modern power electronics power semiconductor devices with voltage blocking capabilities of several kV (kilovolts) such as 5 kV, 6 kV, or 7 kV are needed. In order to implement a circuit arrangement 1 with a power transistor functionality or a power diode functionality and very high voltage blocking capabilities in the range of several kV it may be desirable to implement the second transistor arrangement 30 with second transistors 3 having voltage blocking capabilities higher than several 10V, such as voltage blocking capabilities of several 100V. For example, a circuit arrangement with a voltage blocking capability of 6.5 kV could be implemented with a second transistor arrangement 30 having n=10 second transistors 3 each having a voltage blocking capability of 600V connected in series and with a first transistor 2 having a voltage blocking capability of at least 500V.

However, each of the second transistors 3 is controlled by the load path voltage of the first semiconductor device 2 or the load path voltage V3 of another second transistor 3, so that the drive voltage of each of the second transistors 3 corresponds to the load path voltage of the first semiconductor device 2 or to the load path voltage of another one of the second transistors 3, respectively. Usually, transistors having a voltage blocking capability of several 100V such as 400V, 500V, 600V, or more, are not capable of withstanding a corresponding voltage between the drive terminals, which are the gate and source terminals in a MOSFET. Conventional transistors having a voltage blocking capability of several 100V are only capable to withstand voltages or several 10V between the drive terminals. For example, a conventional depletion MOSFET with a voltage blocking capability of 600V is only capable to withstand a gate-source voltage of between 20V and 30V. Thus, high voltage transistors cannot be interconnected in the transistor arrangement 30 in the same way as low voltage transistors. That is, second transistors 3 implemented as high voltage transistors cannot be interconnected as illustrated in FIG. 1 without facing the risk of having the second transistors 3 damaged. Instead, voltage protection means are required that protect the control terminals of the second transistors 3. Different embodiments of circuit arrangements including such voltage protection means are explained below.

Figure 6:
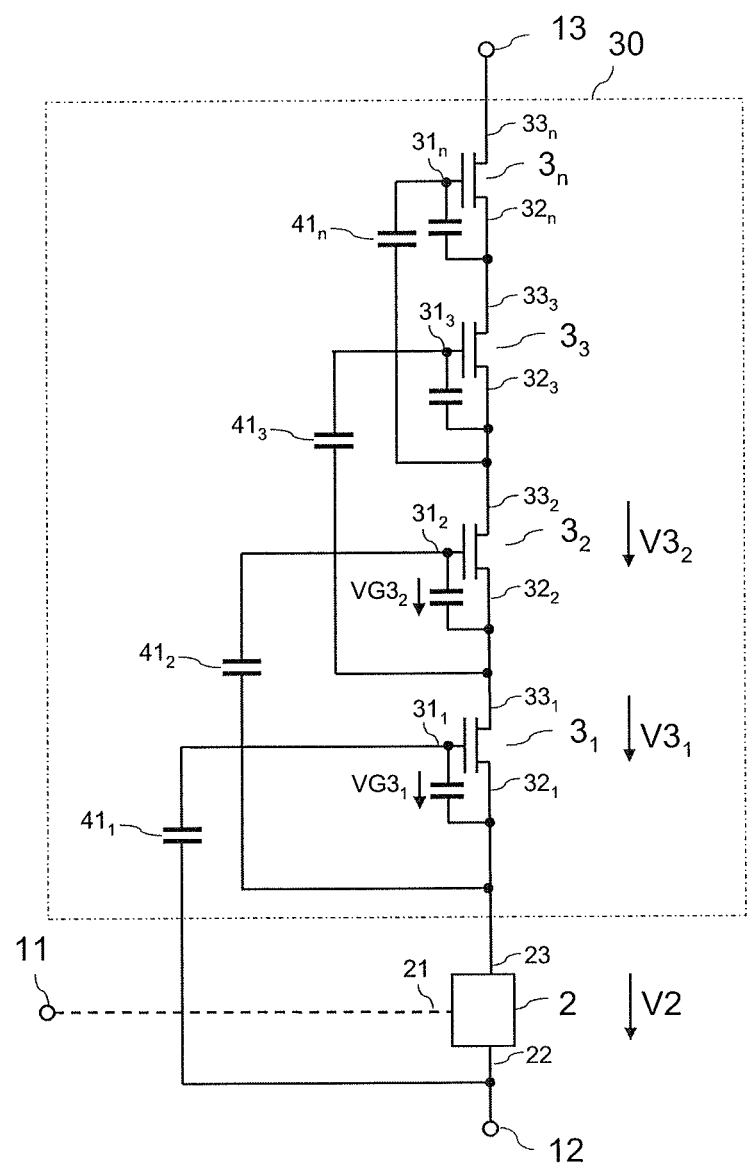
FIG. 6 illustrates a semiconductor device arrangement with voltage limiting elements implemented as capacitors.

FIG. 6 illustrates a circuit arrangement that is based on the circuit arrangement of FIG. 1. In the following, only the differences between the circuit arrangement of FIG. 6 and the circuit arrangement of FIG. 1 are explained, so that for those features that are not explicitly explained in the following the explanation provided with reference to FIG. 1 applies accordingly. In the circuit arrangement of FIG. 6, the control terminals 31 of the individual second transistors 3 are coupled to the associated load terminals via voltage limiting elements $41_1$-$41_n$. The "associated load terminal" of one second transistor 3 is the load terminal the control terminal 31 of the second transistor 3 is coupled to. That is, the load terminal associated with the control terminal $31_1$ of the 1st second transistor $3_1$ is the first load terminal 22 of the first semiconductor device 2, the load terminal associated with the control terminal $31_2$ of the 2nd second transistor $3_2$ is the first load terminal $32_1$ of the $1^{st}$ second transistor $3_1$, and so on. In the embodiment of FIG. 6, the voltage limiting elements $41_1$-$41_n$ are implemented as capacitors connected between the control terminals 31 and the associated load terminals. Each of the second transistors 3 has an internal gate-source capacitance between the gate terminal (control terminal 31) and the first load terminal (source terminal 32). These gate-source capacitances are also illustrated in FIG. 6. In the following, reference character 41 denotes an arbitrary one of the capacitors, VG3 denotes the gate-source voltage of the second transistor 3 the capacitor 41 is connected to, and V3 denotes the load path voltage of the second transistor 3.

Referring to FIG. 6, the capacitor 41 connected between the control terminal 31 and the associated load terminal and the internal gate-source capacitance form a capacitive voltage divider. Unlike the circuit arrangement of FIG. 1 the drive voltage VG3 of the individual second transistors 3 does not correspond to the load voltage, but is only a share of the load voltage. For example, the drive voltage (gate-source voltage) $VG3_2$ of the 2nd second transistor $3_2$ is a share of the load voltage $V3_1$ of the 1st second transistor $3_1$ and is defined by the capacitance ratio of the capacitor $41_2$ that couples the control terminal $31_2$ to the load terminal $32_1$ and the gate-source capacitance as follows:

$$VG3_2 = \frac{C41_2}{CG3_2 + C41_2} \cdot V3_1, \qquad (1)$$

where $VG3_2$ is the gate-source voltage, $C41_2$ is the capacitance of the capacitor $41_2$ and $CG3_2$ is the capacitance of the gate-source capacitance of the second transistor $3_2$. Thus, by suitably adjusting the capacitance of the capacitor 41 to the gate-source capacitance of the second transistor 3 the gate-source voltage VG3 can be limited. Assume, e.g., that $V3_1=600V$ is the maximum load path voltage (the voltage blocking capability) of the $1^{st}$ second transistor $3_1$ and that $VG3_2=20V$ is the maximum gate-source voltage of the transistor $3_2$. In this case, the gate-source voltage can be limited by selecting the capacitance $C41_2$ of the capacitor $41_2$ to be about $\frac{1}{30} \cdot CG3_2$.

According to one embodiment, the individual second transistors 3 are SiC JFETs or SiC depletion MOSFETs with a voltage blocking capabilities of about 600V, or more. Alternatively gallium nitride (GaN) normally-on HEMTs can be used. The individual second transistors 3 may be implemented in one common semiconductor body. However, it is also possible to implement the individual second transistor 3 in different semiconductor bodies. According to one embodiment, the first semiconductor device 2 is implemented as a MOSFET, specifically as an n-type or p-type enhancement MOSFET. This first transistor device 2 may have a voltage blocking capability lower than the voltage blocking capability of the second transistors 2, or may have a voltage blocking capability corresponding to the voltage blocking capabilities of the second transistors 2. According to one embodiment, the voltage blocking capability of the first transistor device 2 is 100V or less. The first semiconductor device 2 may be implemented based on silicon (Si), silicon carbide (SiC), gallium nitride (GaN) or another conventional semiconductor material.

Figure 7:
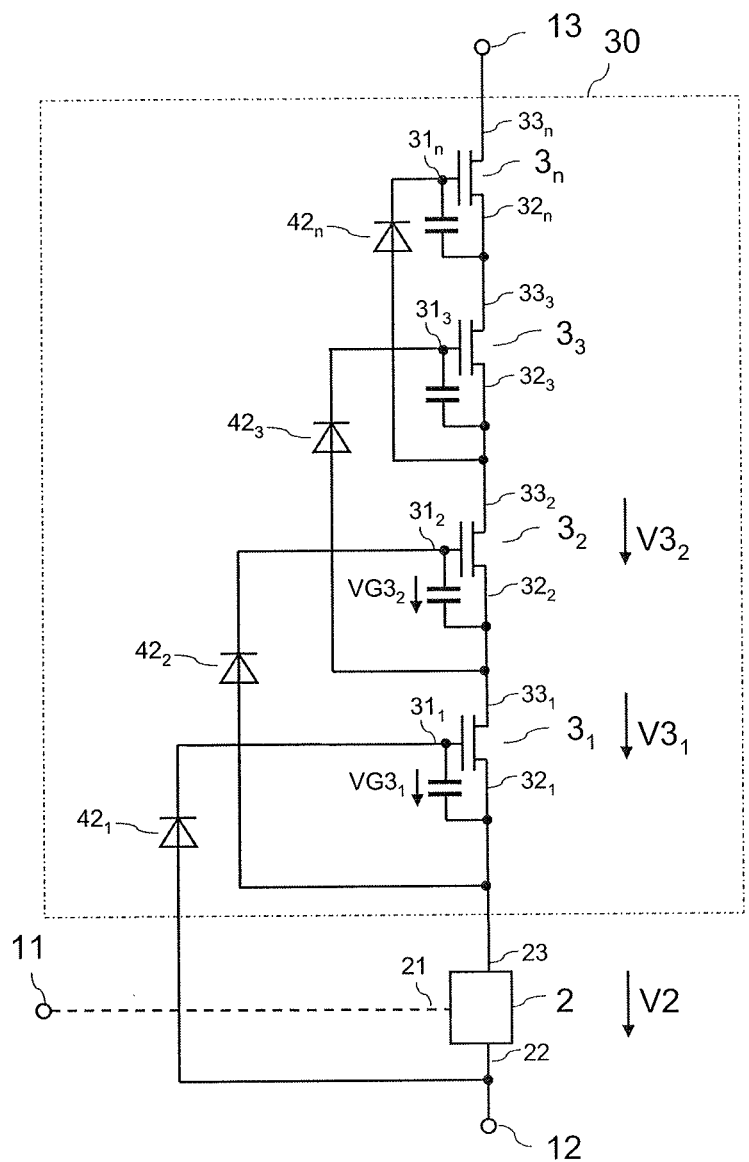
FIG. 7 illustrates a semiconductor device arrangement with voltage limiting elements implemented as diodes.

FIG. 7 illustrates a further embodiment of a circuit arrangement that includes a first semiconductor device 2 and a plurality of second semiconductor devices 3 connected in series with the first semiconductor device 2. In the circuit arrangement of FIG. 7, voltage limiting elements connected between the control terminals 31 of the individual second transistors 3 and the associated load terminals are implemented as rectifier elements, specifically as diodes $42_1\text{-}42_n$. In the embodiment of FIG. 7 in which the individual second transistors 3 are implemented as n-type normally-on transistors, a cathode terminal of each diode $42_1\text{-}42_n$ is connected to the control terminal 31 of the second transistor 3, while the anode terminal is connected to the associated load terminal. The operating principle of the circuit arrangement of FIG. 7 is explained with reference to the diode $42_1$ connected between the control terminal $31_1$ of the second transistor $3_1$ and the first load terminal 22 of the first semiconductor device 2. For explanation purposes it is assumed that the circuit arrangement 1 is in an on-state (conducting state) so that a magnitude of the load path voltage V2 is too low to switch off the second transistor $3_1$. As the load path voltage V2 increases the voltage across the series circuit with the gate-source capacitance and the diode $42_1$ increases. The diode $42_1$ has an internal pn-junction forming a junction capacitor with a capacitance that is dependent on a reverse biasing voltage applied to the diode $42_1$. The capacitance of the junction capacitor decreases as the magnitude of the voltage that reverse biases the diode $42_1$ increases. Thus, the diode $42_1$ and the gate-source capacitance of the 1st second transistor $3_1$ form a capacitive voltage divider. As the first semiconductor device 2 blocks, the load path voltage V2 of the first semiconductor device 2 reverse biases the diode $42_1$. At low load voltages V2, the capacitance of the internal junction capacitor of the diode $42_1$ is relatively large so that (in accordance with equation (1) the load voltage mainly drops across the gate-source capacitor causing the 1st second transistor to block. As the load voltage further increase, the voltage across the diode $42_1$ increases, so that the capacitance of the junction capacitor decreases. This causes the diode 42 to take an increasing share of the overall load voltage V2. The operating principle of the other diodes $42_2\text{-}42_n$ that are controlled by load path voltages V3 of the second transistors $3_1\text{-}3_3$ is equivalent.

Figure 8:
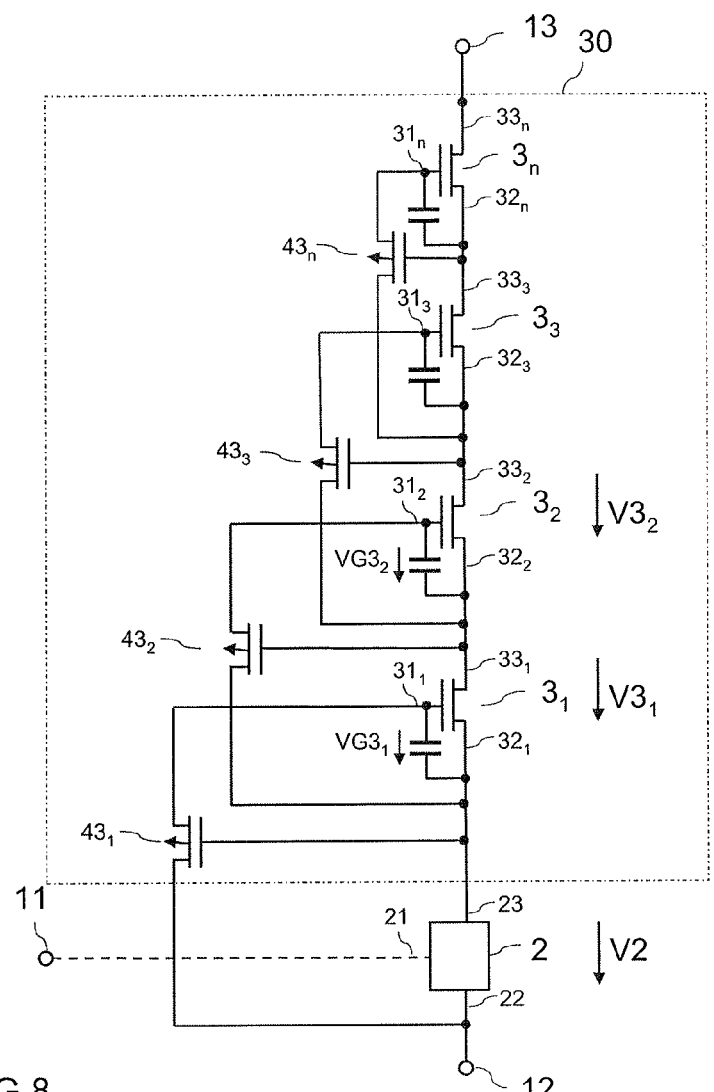
FIG. 8 illustrates a semiconductor device arrangement with voltage limiting elements implemented as normally-on transistors.

A further embodiment of a circuit arrangement with second transistors 3 and voltage limiting elements is illustrated in FIG. 8. In FIG. 8, the individual voltage limiting elements $43_1\text{-}43_n$ are implemented as normally on-transistors such as JFETs or depletion MOSFETs. In the embodiment of FIG. 8, the individual voltage limiting elements $43_1\text{-}43_n$ are depletion FETs. However, this is only an example. The voltage limiting elements could be implemented as any normally-on FETs as well. Each voltage limiting element has a load path (gate-source path) connected between the control terminal 31 of one second transistor 3 and the associated load terminal. Further, a control terminal (gate terminal) is connected to the first load terminal (source terminal) 32 of the second transistor it is associated with. The voltage limiting transistor 43 is controlled by the same voltage as the second transistor 3 it is associated to. The operating principle is explained with reference to the transistor $43_1$ of the second transistor $3_1$ in the following.

For explanation purposes it is assumed that the circuit arrangement is in an on-state (conducting state) and that the load path voltage V2 of the first semiconductor device 2 is too low to switch off the second transistor $3_1$. As the load path voltage V2 increases (when, e.g., the first transistor device 2 switches off) the transistor $43_1$ is conducting at low load path voltages V2 and allows the gate-source capacitance of the second transistor $3_1$ to be charged. When the load path voltage V2 reaches the pinch off voltage of the transistor $43_1$ the transistor $43_1$ switches off and prevents the gate-source voltage $VG3_1$ of the second transistor $3_1$ from increasing further. In the embodiment of FIG. 8, the depletion MOSFETs are p-type MOSFETs having their source terminal connected to the gate control terminal of the associated second transistor 2 and having their drain terminal connected to the first load terminal (source terminal) of another second transistor 2 or the first semiconductor device, respectively.

Figure 9:
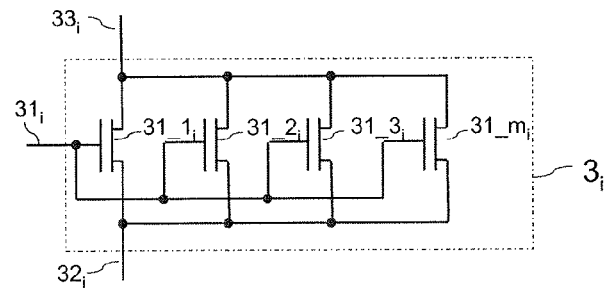
FIG. 9 illustrates one embodiment of one second semiconductor device.

Referring to FIG. 9, that schematically illustrates one transistor 3, of the second transistors $3_1\text{-}3_n$, each of the second transistors $3_1\text{-}3_n$ may be implemented with a plurality of transistors $31\_1_i$, $31\_m_i$ that have their load paths connected in parallel and that have their control terminals coupled to a common control terminal $31_i$. Only one voltage limiting element, such as a capacitor (see FIG. 6), a diode (see FIG. 7) or a transistor (see FIG. 8) is required to protect one of these second transistors with a plurality of transistors connected in parallel.

Figure 10:
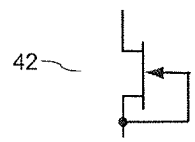
FIG. 10 illustrates an embodiment of a diode implemented as a FET.

In the embodiment of FIG. 7, the individual diodes 42 may each be implemented as a transistor, in particular as a field-effect transistor operating like a diode. A field effect transistor operating like a diode has its drain terminal connected to its gate terminal. FIG. 10 illustrates one embodiment of a JFET, specifically of an n-type JFET, operating like a diode. The drain terminal of the JFET is connected to the gate terminal. The drain terminal forms an anode and the source terminal forms a cathode of the diode implemented by the JFET. Instead of a JFET, any other type of FET (Field-Effect Transistor) may be used as well.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an," and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement, comprising:
a first semiconductor device having a load path;
a plurality of second semiconductor devices, each second semiconductor device having a control terminal and a load path between a first load terminal and a second load terminal, the second semiconductor devices having their load paths connected in series and connected in series with the load path of the first semiconductor device, wherein a load terminal of a first one of the second semiconductor devices is connected to a first load terminal of an adjacent one of the second semiconductor devices; and
a voltage limiting element coupled between the control terminal of the first one of the second semiconductor devices and the second load terminal of the adjacent one of the second semiconductor devices, wherein the voltage limiting element comprises a normally-on transistor.

2. The circuit arrangement of claim 1, wherein the normally-on transistor comprises one of a JFET, a depletion MOSFET, and a FINFET.

3. The circuit arrangement of claim 1, wherein the normally-on transistor comprises one of a SiC JFET, a SiC depletion MOSFET, and a GaN HEMT.

4. The circuit arrangement of claim 1, wherein the normally-on transistor comprises a load path connected between the control terminal of the first one of the second semiconductor devices and the second load terminal of the adjacent one of the second semiconductor devices, and a control terminal coupled to the first or second load terminals of the first one of the second semiconductor devices.

5. The circuit arrangement of claim 1, wherein the voltage limiting element comprises a depletion MOSFET.

6. The circuit arrangement of claim 5, wherein:
the second semiconductor devices comprise JFET transistors; and
the first semiconductor device comprises an enhancement MOSFET.

7. The circuit arrangement of claim 5, wherein:
the second semiconductor devices comprise depletion MOSFET transistors; and
the first semiconductor device comprises an enhancement MOSFET.

8. The circuit arrangement of claim 1, wherein the first semiconductor device comprises a depletion MOSFET.

9. The circuit arrangement of claim 1, wherein the first semiconductor device comprises a diode.

10. The circuit arrangement of claim 1, wherein the voltage limiting element is one of a plurality of voltage limiting elements, each voltage limiting element being coupled between the control terminal of one of the second semiconductor devices and the second load terminal of an adjacent one of the second semiconductor devices.

11. A circuit arrangement, comprising:
a first semiconductor device having a load path;
a plurality of second semiconductor devices, each second semiconductor device having a control terminal and a load path between a first load terminal and a second load terminal, the second semiconductor devices having their load paths connected in series and connected in series with the load path of the first semiconductor device, wherein a load terminal of a first one of the second semiconductor devices is connected to a first load terminal of an adjacent one of the second semiconductor devices; and
a voltage limiting element coupled between the control terminal of the first one of the second semiconductor devices and the second load terminal of the adjacent one of the second semiconductor devices, wherein the voltage limiting element comprises a depletion MOSFET.

12. The circuit arrangement of claim 11, wherein:
the second semiconductor devices comprise JFET transistors; and
the first semiconductor device comprises an enhancement MOSFET.

13. The circuit arrangement of claim 11, wherein:
the second semiconductor devices comprise depletion MOSFET transistors; and
the first semiconductor device comprises an enhancement MOSFET.

* * * * *